(12) United States Patent
Shou et al.

(10) Patent No.: US 6,563,373 B1
(45) Date of Patent: May 13, 2003

(54) FILTER CIRCUIT UTILIZING A PLURALITY OF SAMPLING AND HOLDING CIRCUITS

(75) Inventors: Guoliang Shou, Tokyo (JP); Kunihiko Suzuki, Tokyo (JP); Changming Zhou, Tokyo (JP)

(73) Assignee: Yozan, Inc., Tokyo (JP)

( * ) Notice: Subject to any disclaimer, the term of this patent is extended or adjusted under 35 U.S.C. 154(b) by 0 days.

(21) Appl. No.: 09/165,301

(22) Filed: Oct. 2, 1998

(30) Foreign Application Priority Data

Oct. 2, 1997 (JP) ............................................... 9-284264
Nov. 14, 1997 (JP) ............................................... 9-331166

(51) Int. Cl.[7] ............................ H03H 15/02; G06F 7/48; G06G 7/12

(52) U.S. Cl. ........................... 327/554; 327/94; 327/356; 327/361; 333/166

(58) Field of Search ................................ 327/552, 553, 327/554, 94, 95, 356, 361; 375/229, 232, 233; 333/18, 28 R, 166

(56) References Cited

U.S. PATENT DOCUMENTS

| | | | | | |
|---|---|---|---|---|---|
| 3,912,917 A | * | 10/1975 | Nussbaumer | ................ | 327/552 |
| 3,931,604 A | * | 1/1976 | Treynor | ........................ | 327/552 |
| 4,308,618 A | * | 12/1981 | Levy et al. | ................... | 327/167 |
| 4,335,396 A | * | 6/1982 | Rzeszewski | ................. | 348/614 |
| 4,363,976 A | * | 12/1982 | Minor | .......................... | 327/94 |
| 5,252,932 A | * | 10/1993 | Someya et al. | .............. | 333/166 |
| 5,311,087 A | * | 5/1994 | Suganuma | .................... | 327/551 |
| 5,513,215 A | * | 4/1996 | Marchetto et al. | ........... | 375/233 |
| 5,565,809 A | * | 10/1996 | Shou et al. | ................... | 327/356 |
| 5,736,909 A | * | 4/1998 | Hauser et al. | ............... | 333/166 |
| 6,208,685 B1 | * | 3/2001 | Yamazaki | ..................... | 327/91 |

* cited by examiner

Primary Examiner—Timothy P. Callahan
Assistant Examiner—Terry L. Englund
(74) Attorney, Agent, or Firm—Armstrong, Westerman & Hattori, LLP

(57) ABSTRACT

An analog calculation circuit in a filter circuit is corrected in the calculation error by estimating the error from a calculation result of known inputs and known multiplier. A multiplier is changed according to the estimated error. The filter circuit has a voltage to current converter at an input side and a current to voltage converter at an output side and a calculation of current is performed therein.

8 Claims, 12 Drawing Sheets

(a)

(b)

(c)

(a)

(b)

FILTER CIRCUIT UTILIZING A PLURALITY OF SAMPLING AND HOLDING CIRCUITS

FIELD OF THE INVENTION

The present invention relates to a filter circuit applicable to a matched filter for a spread spectrum communication system.

BACKGROUND OF THE INVENTION

A matched filter judges whether two signals are the same. In a spread spectrum communication system, such as mobile cellular radio or wireless local area network (LAN), each user processes a received signal by the matched filter having a spreading code allocated. A correlation peak is detected from the output of the matched filter so that synchronization, acquisition and holding are performed.

When the spreading code is PN(i), chip time is Tc, spreading ratio is M, and an input signal and correlation output are S(t) and R(t) at a time t, the following formula (1) is given.

$$R(t) = \sum_{i=0}^{M-1} PN(i) \cdot S(t - i \cdot Tc) \tag{1}$$

Here, PN(i) is a sequence of one bit data.

Double sampling or higher order over sampling is necessary for acquisition, so a plurality of matched filters are needed. The calculation of formula (1) is performed in a plurality of matched filters simultaneously, and one of the calculation results is selectively output or a plurality of outputs are added. The matched filter is constructed by a digital circuit or a surface acoustic wave (SAW) device. The former has large circuit size and consumes a lot of electrical power. Therefore it is inadequate for a mobile phone. The latter has a low S/N ratio and it is difficult to incorporate it with other circuits within one large scale integrated circuit (LSI).

The inventors of the present invention have considered the filter circuits above based on an analog calculation circuit. The analog calculation circuit has an inverting amplifier, and input capacitance connected to an input of the amplifier and a feedback capacitance connected between the input and an output of the amplifier. A sampling and holding circuit, adder, multiplication circuit, integration circuit and other circuits of high speed, low power and high accuracy circuits are realized.

FIG. 18(a) shows an example of such an analog calculation circuit. V1 and V2 are input terminals, Vo is an output terminal and INV is an inverting amplifier. The inverting amplifier INV consists of CMOS inverters working in an area of transition of output from high level to low level or from low level to high level. An odd number of CMOS inverters, shown as three stages of CMOS inverters 201, 202 and 203 in the figure, are serially connected. A serial circuit of resistance R and a capacitance C is connected between an input and output of the CMOS inverter 202. This serial circuit works as a negative feedback circuit as well as a load of the CMOS 202 for decreasing the gain of the inverting amplifier INV. A capacitance Cg is connected to the inverting amplifier INV for phase compensation so that unexpected oscillation is prevented.

Input capacitances C1 and C2 are connected between a point B at the input of INV and the input terminal V1, and between the point B and V2, respectively. A feedback capacitance Cf is connected between the output terminal Vo and the point B.

The gain of the inverting amplifier is very high, so the voltage at the point B is a constant value Vb. The point B is connected to the gate of the transistors of the CMOS inverter 201 and is a floating point or insulated point from any electrical source.

Assuming that the electrical charge of the capacitances is zero at the initial condition, the total charge at point B is zero after voltages V1 and V2 are input. Thus resulting in the following formula (2) of "preservation of electrical charge".

$$C_1(V_1-Vb)=C_2(V_2-Vb)+Cf(V_0-Vb)=0 \tag{2}$$

When V1 and V2 are voltages from the voltage Vb with point B as a reference point, and defining V(1)=V1−Vb, V(2)=+V2−Vb and Vout=Vo−Vb provides formula (3) which is obtained from the formula (2).

$$Vout = -\left(\frac{C_1}{Cf}V(1) + \frac{C_2}{Cf}V(2)\right) \tag{3}$$

A voltage Vout is output as an inverted voltage of a summation of input voltages V(i) (i=1,2) multiplied by a coefficient (Ci/Cf), a ratio of the input capacitance Ci and the feedback capacitance Cf.

The voltage Vb at the point B is usually Vdd/2 for maximizing the dynamic range. This voltage is called Vref, hereinafter. and Vref=+Vb=Vdd/2.

If C1=C2=Cf, the output voltage Vout=−{V(1)+V(2)}. A summation of both input voltages is thus obtained and, an adder is realized.

As shown in FIG. 18(b), a similar relationship to the above is applicable when more input voltages are input. Then, the formula (4) is obtained.

$$Vout = -\left(\frac{C_1}{Cf}V(1) + \frac{C_2}{Cf}V(2) + \ldots + \frac{C_i}{Cf}V(i) + \ldots + \frac{C_n}{Cf}V(n)\right) \tag{4}$$

If the input capacitances Ci (i=1 to n) are equal to Cf, that is, Ci=Cf (i=1 to n), an output voltage is obtained as a summation of input voltages. An adder of a plurality of inputs is realized.

A sampling and holding circuit using the above analog circuit is shown in FIG. 19. Vin is an input voltage, SW is a sampling switch, Cin is an input capacitance connected to the input of the inverting amplifier INV, Cf is a feedback capacitance and Vout is an output voltage. The input capacitance and the feedback capacitance have equal values. The sampling switch SW is for example a switching circuit consisting of a MOS transistor such as CMOS transmission gate.

The sampling and holding circuit corresponds to a circuit shown in FIG. 18(a) wherein the number of inputs is reduced to one. Since Cin and Cf are equal to each other, Vout=−Vin. At first the sampling switch SW is closed so as to sample the input signal. When SW is opened, an inverted voltage of the input voltage at the time is output from the ouput terminal The voltage is held until the sampling switch SW is closed. Accordingly, a sampling and holding circuit is realized.

An analog digital multiplication circuit using the above analog calculation circuit is shown in FIG. 20. Vin is an input voltage, Vref is the reference voltage and Vref=Vdd/2=Vb. $MUX_1$ to $MUX_n$ are multi-plexers for switching capacitances having the first input terminals connected to V1, the second input terminals connected to Vref and output terminal connected to $C_1$ to $C_n$, respectively. Control signals $d_1$ to $d_n$ are input to the multi-plexers $MUX_1$ to $MUX_n$, respectively. Vin is selected to be input to C1 when di (i=1 to n) is "1", and Vref is selected when di (i=1 to n) is "0".

The capacitances $C_1$ to $C_n$ have capacity ratios that are powers of "2", as defined by formula (5)

$$C_N = 2C_{N-1} = \ldots = 2^i C_{H-i} = \ldots = 2^{n-1} C_1 \tag{5}$$

The formula for holding electrical charge is defined by equation (6).

$$\sum_{i=1}^{n} C_i d_i (V_{IN} - Vb) + \sum_{i=1}^{n} C_i (1 - d_i)(V_{ref} - Vb) + Cf(Vout - Vb) = 0 \tag{6}$$

The output voltage Vout is defined by formula (7), wherein Vref=Vb.

$$Vout = -\frac{1}{Cf} \sum_{i=1}^{n} C_i d_i V_{in} = \frac{C_1}{Cf} V_{in} \sum_{i=1}^{n} 2^{n-i} d_i \tag{7}$$

Vin multiplied by a binary number on n-bits corresponding to $d_1$ to $d_n$ is obtained as Vout. Therefore, a multiplication circuit for multiplying an analog data by a digital data is realized.

Various analog calculation circuits can be constructed by the above analog calculation circuit. The analog calculation circuit is a voltage driven type, so the electrical power consumption is very low. The circuit is easy to incorporate within an LSI. Various circuits other than the filter circuit (ADF: analog digital filter) can be realized using the sampling and holding circuit, multiplication circuit and adder above.

The above analog calculation circuit has a calculation error due to an error of the capacity ratio (inclination) caused by parasitic capacitance of wiring and manufacturing deviation of capacitances. In mass-production, it is difficult to correct the error by additional resistance or additional capacitance because each LSI may have differing errors from others and adjacent circuits within one LSI may have different errors.

SUMMARY OF THE INVENTION

The present invention has an object to provide a filter circuit of smaller circuit size and lower power consumption than the conventional filter.

The present invention has another object to provide a filter circuit of higher accuracy than the conventional circuit.

According to the present invention, an analog calculation circuit in a filter circuit corrects the calculation error by estimating the error from a calculation result of known inputs and a known multiplier. A multiplier is changed according to the estimated error.

According to the present invention, a filter circuit has a voltage to current converter at an input side and a current to voltage converter at an output side and a calculation of current is performed therein.

DETAILED DESCRIPTION

The first embodiment of a filter circuit according to the present invention is described, below.

Figure 1:
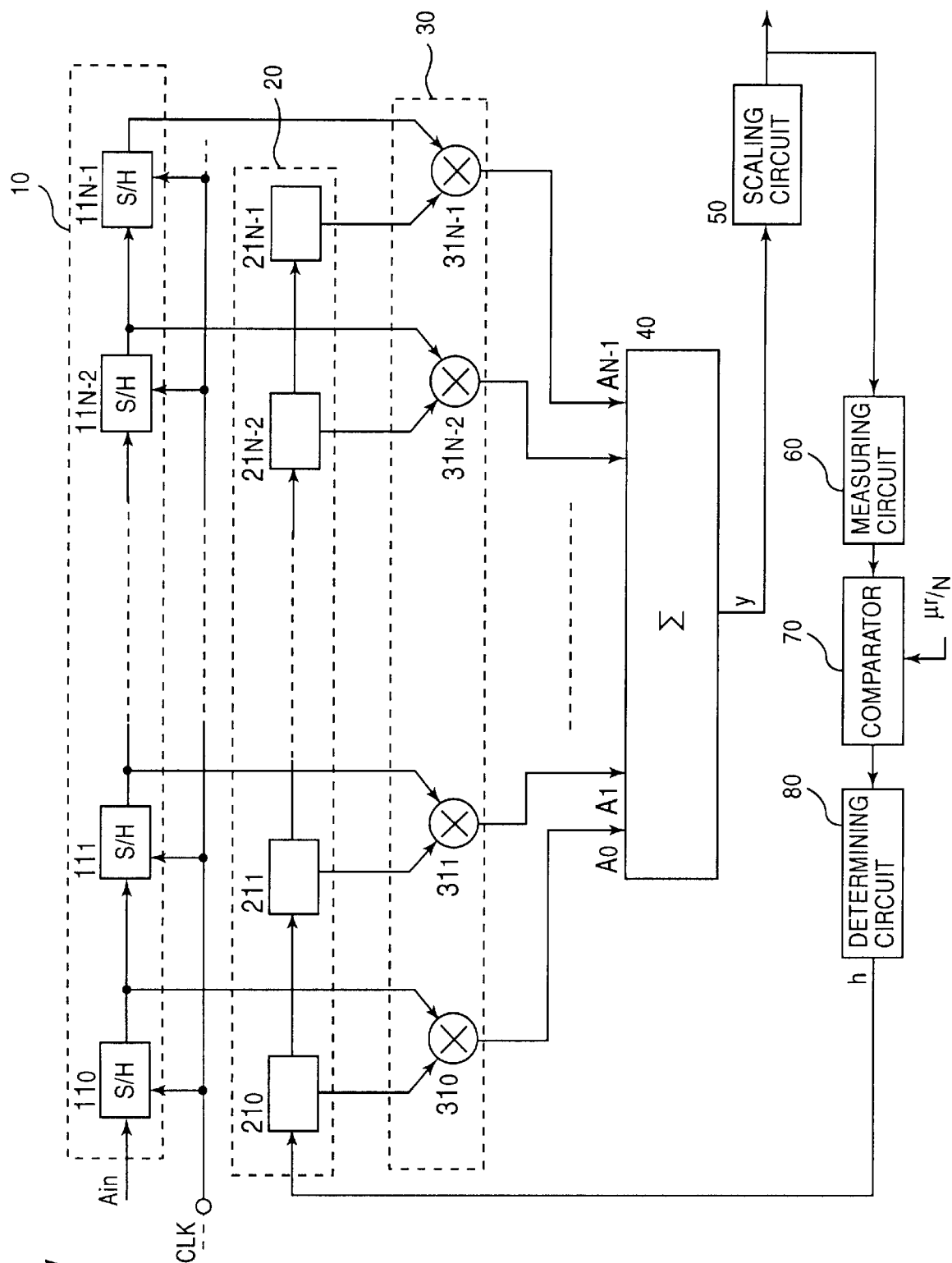
FIG. 1 is a block diagram of the first embodiment of the filter circuit of the present invention.

In FIG. 1, there is shown in filter circuit having a group 10 of N stages of serial sampling and holding circuits $11_n$ to $11_{N-1}$, a group 20 of N stages of coefficient registers $21_0$ to $21_{N-1}$ corresponding to the sampling and holding circuits and a group 30 of N stages of multiplication circuits $31_0$ to $31_{N-1}$ corresponding to the sampling and holding circuits. An input signal Ain is input to the first stage $11_0$, and a sampling clock of a period T is provided to the total sampling and holding circuits. The sampling and holding circuits transfer the input signal Ain in response to the sampling clock one after another toward the last stage $11_{N-1}$.

The input signal held by each sampling and holding circuit is multiplied in the corresponding multiplication circuit by a coefficient stored in the corresponding coefficient register. The group of the coefficient registers consists of a shift register of N stages, each stage storing a coefficient h by which the signal Ain in the corresponding sampling and holdiong circuit is multiplied.

Each multiplication circuit is an analog-digital multiplication circuit receiving an output signal (analog signal) from the corresponding sampling and holding circuit and a coefficient (digital signal) from the corresponding coefficient register. The multiplication circuits $31_0$ to $31_{N-1}$ multiply the discrete input signals Ain by the coefficients h, respectively.

An adder 40 is connected to the multiplication circuits $31_0$ to $31_{N-1}$ for adding the outputs of the multiplication circuits together. An addition result y is output from the adder to a scaling circuit 50 for adjusting y to be a predetermined level and transferring an output to the following circuits.

An output from scaling circuit 50 is input into a measuring circuit 60 so that a measured value of the output can be obtained. The measured value is fed into a comparator 70 to be compared with a theoretical value based on a formula $\mu\gamma/N$. A comparison result is input into a determining circuit 80 to determine whether there is an agreement between the comparison result and a coefficient h. A determination result is then fed into coefficient registers $21_0$.

Figure 2:
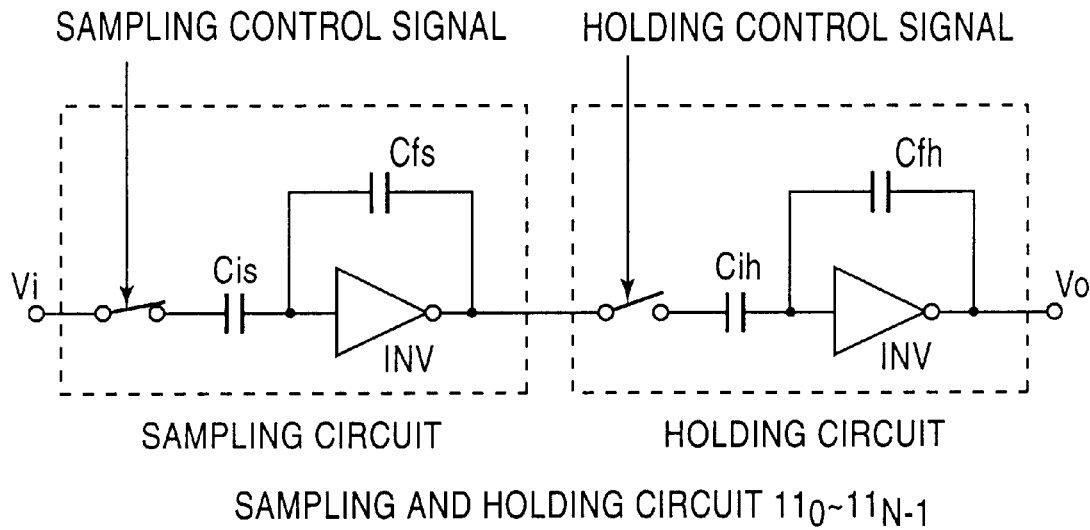
FIG. 2 is a circuit diagram of a sampling and holding circuit of the first embodiment.

As shown in FIG. 2, each of the sampling and holding circuits $11_0$ to $11_{N-1}$ consists of a sampling circuit and a holding circuit serially connected. The sampling circuit includes an input switch connected to an input signal Vi, an input capacitance Cis connected to an output of the input switch, an inverting amplifier INV connected to an output of the input capacitance and a feedback capacitance Cfs for connecting an output of INV to its input. The holding circuit includes an input switch connected to an output of the sampling circuit, an input capacitance Cih connected to an output of the input switch, and inverting amplifier INV connected to an output of the input capacitance and a feedback capacitance Cfh for connecting an output of INV to its input. The capacity ratio fo (Cfs/Cis)=(Cih/Cfh)–1. The input switch of the sampling circuit is controlled by a sampling control signal and the input switch of the holding circuit is controlled by a holding control signal on an inverted signal of the sampling control signal. When the sampling control signal is at a high level and the holding control signal is at a low level, the input voltage Vi is input to the sampling circuit. An inverter signal of the sampled signal is output from the inverting amplifier INV. The inverted signal is input to the holding circuit and its inverted signal, that is, the same signal as the input signal Vi is output from the holding circuit.

Figure 3:
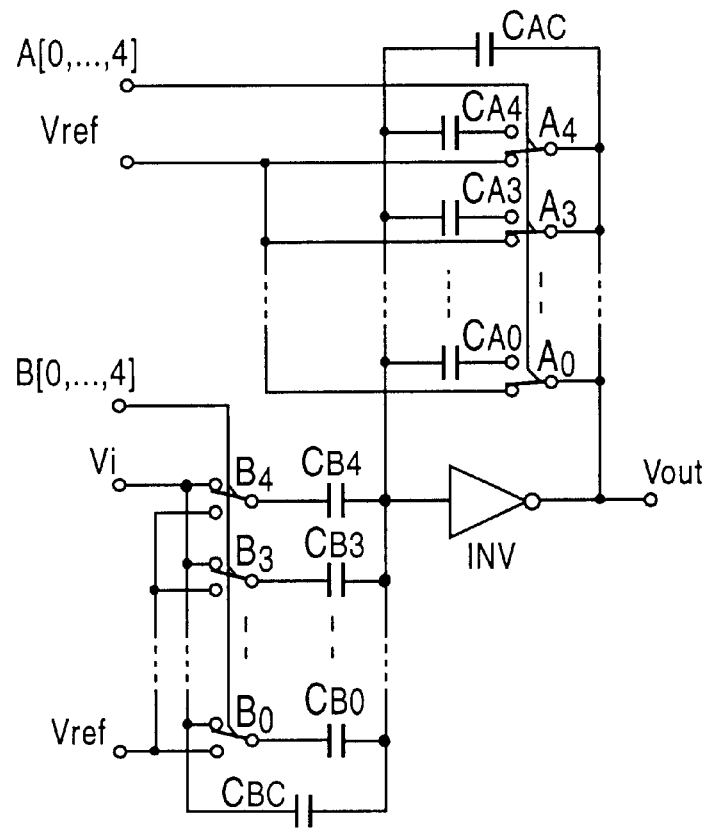
FIG. 3 is a circuit diagram of a scaling circuit of the first embodiment.

FIG. 3 shows a scaling circuit 50 for adjusting a level of input signal Vi according to 5 bit digital data A[0, . . . , 4] and B[0, . . . , 4]. The digital data B[0, . . . , 4] controls the input capacitance, and the digital data A[0, . . . , 4] controls the feedback capacitance. The input capacitance consists of capacitances $C_{B0}$ to $C_{B4}$ and $C_{BC}$, and the feedback capacitance consists of capacitances $C_{A0}$ to $C_{A4}$ and $C_{AC}$. Each input of the capacitances $C_{B0}$ to $C_{B4}$ is alternatively connected to the input signal or a reference voltage Vref through switches B0 to B4. These switches are controlled by the signal B[0, . . . , 4]. Each output of the capacitances $C_{B0}$ to $C_{B4}$ is connected to an input of an inverting amplifier INV and the switches alternatively connect the output of the inverting amplifier to the feedback capacitances or the reference voltage Vref. When a composite capacity of the input capacitances is $C_{B0}$ a composite capacity of the feedback capacitances is $C_{Am}$ $C_{Am}$ is $2^m$ (m=0 to 4) and $C_{Bn}$ is $2^n$ (n=0 to 4). An output voltage Vout is output from the scaling circuit 50, as in the formula (8).

$$Vout = \left( \frac{C_{BC} + \sum_{i=0}^{4} Bi \cdot C_{Bi}}{C_{AC} + \sum_{i=0}^{4} Ai \cdot C_{Ai}} \right) \cdot Vin \quad (8)$$

Therefore, the output of the scaling circuit can be adjusted according to a scaling factor defined by the input capacitances and feedback capaitances.

The filter circuit in FIG. 1 performs a calculation of FIR filter as in the formula (9).

$$y(kT) = \sum_{n=0}^{N-1} h(nT) \cdot x(kT - nT) \quad (9)$$

Here, T is the sampling interval, N is the number of taps, k is an integer from $-\infty$ to $+\infty$, x is an input signal, y is an output signal and h is the coefficient.

In the formula (9), errors are neglected such as errors in the capacity ratio (inclination) of input capacitances and feedback capacitances due to floating capacity, manufacturing deviation and so forth. These errors are hereinafter represented by a capacity error factor. Errors caused by offset voltage in the operational amplifier or other circuit components are hereinafter represented by an offset factor. When the capacity error factor is defined as "$\alpha_n$" and the offset factors as "$\beta_n$" formula (9) becomes formula (10), which includes these error factors. The formula (9) is rewritten to be formula (10) when these errors are included.

$$y(kT) = \sum_{n=0}^{N-1} h(nT) \cdot \{\alpha_n \cdot x(kT - nT)\} + \sum_{n=0}^{N-1} n(nT) \cdot \beta_n$$

Since the second term of the total sum of "$h(nT)\beta_n$" is constant in a predetermined filter with predetermined coefficients, the total error can be decreased by correcting only the first term in response to the input signal when the second term is evaluated in advance. Here, $\alpha_n$ is the capacity error factor and is calculated as in the formula (11) when the sampling and holding circuits $11_0$ to $11_{N-1}$ have errors of $a_0$ to $a_{N-1}$.

$$\alpha_0 = a_0 \quad (11)$$
$$\alpha_1 = a_0 \times a_1$$
$$\alpha_2 = a_0 \times a_1 \times a_2$$
$$\alpha_3 = a_0 \times a_1 \times a_2 \times a_3$$
$$\vdots$$
$$\alpha_{N-1} = a_0 \times a_1 \times a_2 \times a_3 \times \ldots \times a_{N-1}$$

The errors can be corrected by amending the coefficient h as in the formula (12).

$$\frac{1}{\alpha_n} \cdot h(nT) \ (n = 0, 1, 2, ..., N - 1) \quad (12)$$

By the error correction of formula (12), the output is similar to that of formula (9) free from the errors, as in formula (13).

$$y(kT) = \sum_{n=0}^{N-1} \frac{1}{\alpha_n} \cdot h(nT) \cdot \alpha_n \cdot x(kT - nT) \quad (13)$$

The error $\alpha_n$ is predicted by the following 5 steps.
Step 1: Changing the coefficient of the first tap to be maximum, for example "127" and changing other coefficients to be "0".
Step 2: Setting the scaling factor to be "1" so that the output is equal to the input.
Step 3: Inputting a predetermined input signal and recording the output signal in response to the input signal.
Step 4: Changing the coefficient of the second to the last taps to be maximum, successively, and repeat Steps 2 and 3.

Step 5: Comparing the theoretical inclination and the measured inclination so as to obtain the error in the inclination. Then, the error $\alpha_n$ os obtained.

Figure 4:
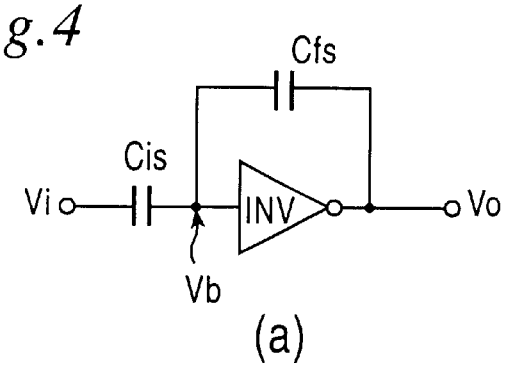
FIGS. 4(a) to (c) are circuit diagrams showing performance of the sampling and holding circuit.
Figure 4:
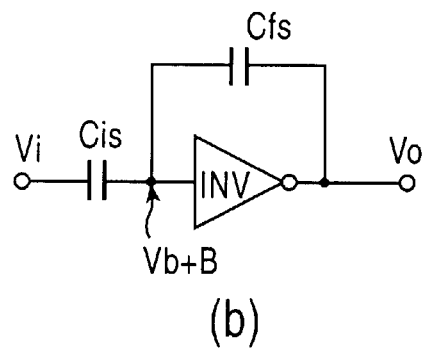
Figure 4:
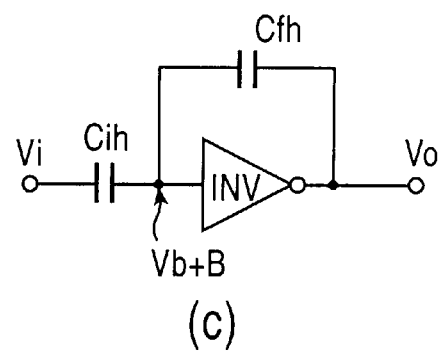

FIGS. 4(a)–4(c) show the error prediction process. FIG. 4(a) is a circuit without error. When the inclination is "1", that is, the ratio Cis and Cfs is "1" as in formula (14). The following formula (15) is given.

$$\frac{Cis}{Cjs} = 1 \tag{14}$$

$$Vo = -(Vi - Vb) + Vb = -Vi + 2Vb \tag{15}$$

When an error occurs as in FIG. 4(b), that is, Cis/Cis≠1, and an error B is included in the bias voltage, the output is as shown in the formula (16).

$$Vo = -\frac{Cis}{Cfs}Vi + \left(\frac{Cis}{Cfs} + 1\right)(Vb + B) \tag{16}$$

α and β are defined as in the formulae (17) and (18).

$$\frac{Cis}{Cfs} = \alpha_s \tag{17}$$

$$\beta_s = \left(\frac{Cis}{Cfs} + 1\right)(Vb + \beta) - 2Vb \tag{18}$$

The output of the sampling circuit in FIG. 4(b) is as in the formula (19).

$$Vo = -\alpha_s Vi + 2Vb + \beta_s \tag{19}$$

When the holding circuit of FIG. 4(c) has an error α h in the inclination, the formula (20) is given.

$$Vo = -\alpha_h Vi + 2Vb + \beta_h \tag{20}$$

The output of the sampling circuit shown in the formula (19) is input to the holding circuit which outputs an output as in the formula (21).

$$Vo = -\alpha_h(-\alpha_s Vi + 2Vb + \beta_R) + 2Vb + \beta_h$$

$$\phi = \alpha_s \alpha_h Vi - \alpha_h 2Vh - \alpha_h \beta_s + 2Vb + \beta_h \tag{21}$$

When α and β are rewritten as in the formula (22) and (23), the output of the holding circuit is as in the formula (24).

$$\alpha = \alpha_s \alpha_b \tag{22}$$

$$\beta = \alpha_h 2Vb - \alpha_h \beta_s + 2Vb + \beta_h \tag{23}$$

$$Vo = \alpha V1 + \beta \tag{24}$$

The output of the holding circuit is one of the inputs to the multiplication circuits $31_0$ to $31_{N-1}$.

Figure 5:
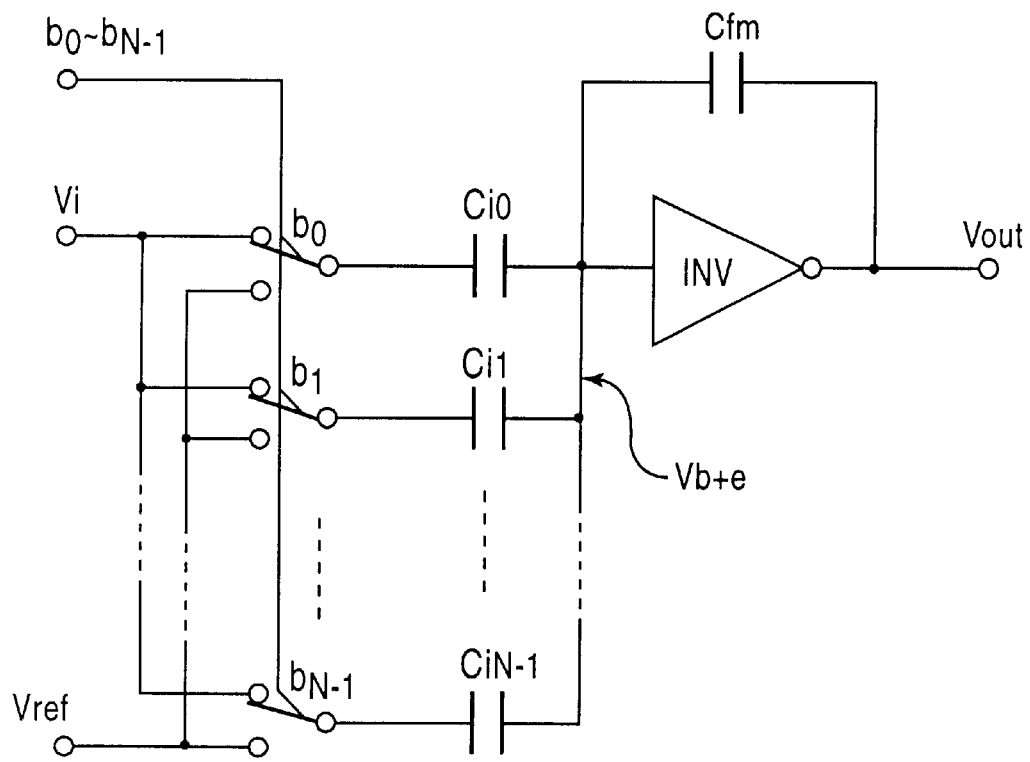
FIG. 5 is a circuit diagram of a multiplication circuit of the first embodiment.

Next, the error propagation in the multiplication circuit is discussed with reference to FIG. 5. When an error in the bias voltage of the multiplication circuit is e, the output of the multiplication circuit is given as in the formula (25).

$$Vo = -\sum_{n=0}^{N-1}\frac{Cin \cdot bn}{Cfm}Vin + \sum_{n=0}^{N-1}\frac{Cin \cdot bn}{Cfm}(Vb+e) + Vb + e + \tag{25}$$

-continued $$\sum_{n=0}^{N-1}\frac{Cin \cdot \overline{bn}}{Cfm}e$$

$$= -\sum_{n=0}^{N-1}\frac{Cin \cdot bn}{Cfm}Vin + \sum_{n=0}^{N-1}\frac{Cin \cdot bn}{Cfm}Vb + Vb + e + \sum_{n=0}^{N-1}\frac{Cin}{Cfm}e$$

Here, Vref=+Vb, and b is the control signal of the multiplication circuit, that is, multipliers.

γ is defined in the formula (26).

$$\gamma = \sum_{n=0}^{N-1}\frac{Cn \cdot bn}{Cfm} \tag{26}$$

The multiplication circuit has an error δ in its inclination that is independent from γ. The output voltage Vo can be expressed as in the formula (27).

$$Vo = -\delta\gamma Vi + (\delta\gamma + 1)Vb + \left(\sum_{n=0}^{N-1}\frac{Cin}{Cfm} + 1\right)e \tag{27}$$

When the input voltage Vi of the multiplication circuit is substituted by the output of the sampling and holding circuit, the output is as in the formula (28).

$$Vo = -\delta\gamma(\alpha Vi + \beta) + (\delta\gamma + 1)Vb + \left(\sum_{n=0}^{N-1}\frac{Cin}{Cfm} + 1\right)e \tag{28}$$

$$= -\delta\gamma\alpha Vi - \delta\gamma\beta + (\delta\gamma + 1)Vb + \left(\sum_{n=0}^{N-1}\frac{Cin}{Cfm}\right)e$$

When ζ is defined as in the formula (29), the output voltage Vo is given by the formula (30). This output is input to the adder following the multiplication circuit.

$$\zeta \simeq -\delta\gamma\beta + \left(\sum_{n=0}^{N-1}\frac{Cin}{Cfm} + 1\right)e \tag{29}$$

$$Vo = -\delta\gamma\alpha Vi + (\delta\gamma + 1)Vb + \zeta \tag{30}$$

Figure 6:
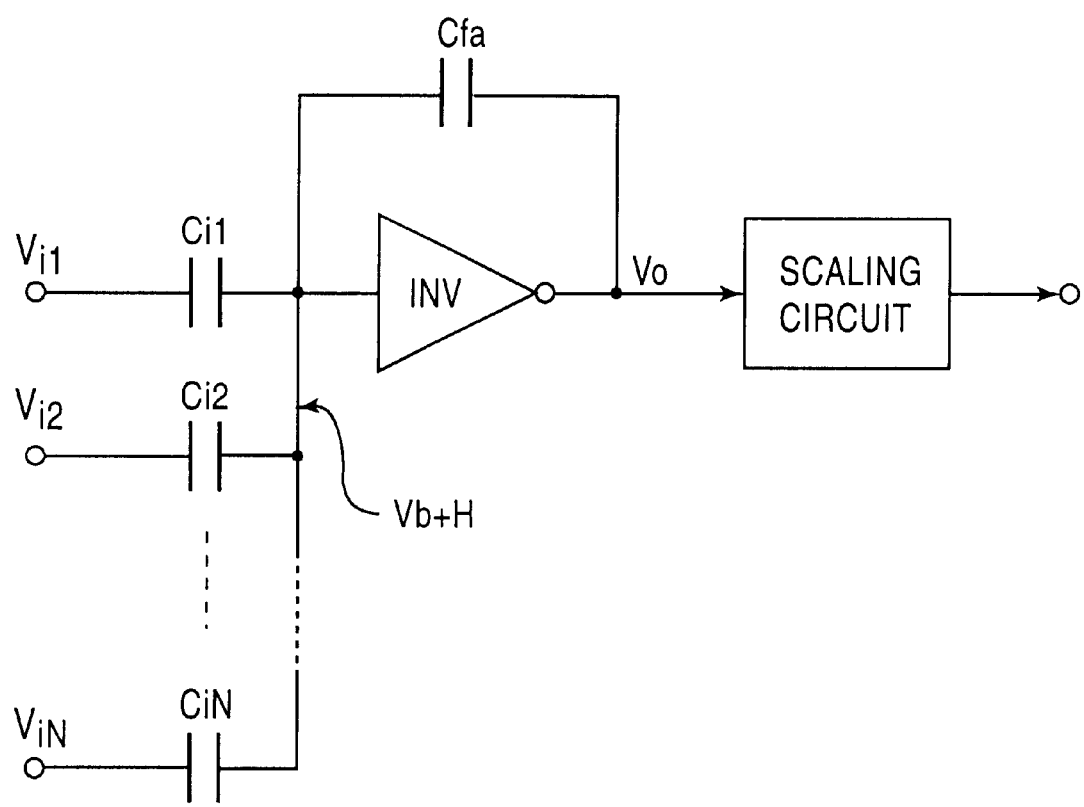
FIG. 6 is a circuit diagram of an adder of the first embodiment.

Next, the error propagation in the adder 40 is discussed with reference to FIG. 6. When input voltages are Vi1 to ViN, input capacitances are Ci1 to CiN and a feedback capacitances is Cfa, the theoretical output of the adder is as in the formula (31).

$$Vo = \tag{31}$$

$$-\frac{C_{i1}}{C_{fa}}V_{i1} - \frac{C_{i2}}{C_{fa}}V_{i2} - \ldots - \frac{C_{iN}}{C_{fa}}V_{iN} + \frac{C_{i1} + C_{i2} + \ldots + C_{iN} + C_{fa}}{C_{fa}}Vb$$

When the error in the bias voltage of the adder 40 is H, the output of the multiplication circuit having the maximum coefficient is Vi1 and the outputs of other multiplication circuits having the coefficient of "0" are Vi2 to ViN, Vi1 can be expressed as in the formula (30). Vi2 to ViN are Vb−ζj (j=2 to N). Then, the output of the adder 40 is as in the formula (32).

$$V_o = -\frac{C_{i1}}{C_{fa}}(-\delta\gamma\alpha V_i + (\delta\gamma+1)V_b + \zeta_1) - \frac{C_{i1}}{C_{fa}}(V_b + \zeta_2) - \ldots - \quad (32)$$
$$\frac{C_{iN}}{C_{fa}}(V_b + \zeta_N) + \frac{C_{i1} + C_{i2} + \ldots + C_{iN} + C_{fa}}{C_{fa}}(V_b + H)$$
$$= \frac{C_{i1}}{C_{fa}}\delta\gamma\alpha V_i - \frac{C_{i1}}{C_{fa}}((\delta\gamma+1)V_b + \zeta_1) - \frac{C_{i1}}{C_{fa}}(V_b + \zeta_2) - \ldots -$$
$$\frac{C_{iN}}{C_{fa}}(V_b + \zeta_N) + \left(\frac{C_{i1} + C_{i2} + \ldots + C_{iN}}{C_{fa}} + 1\right)(V_b + H)$$

In the formula (32), the terms not including Vi are constant and can be expressed by $\zeta$. The ratio of Ci1 and Cfa is defined as in the formula (33).

$$\frac{C_{i1}}{C_{fa}} = \theta\frac{1}{N} \quad (33)$$

Here, $\theta$ is the error in the inclination of the adder 40 and N is the number of inputs of the adder. The output of the adder 40 is as in the formula (34).

$$V_o = \theta\frac{1}{N}\delta\gamma\alpha V_i + \eta \quad (34)$$

The output is input to the scaling circuit 50.

When the scaling factor is $\mu$, its error independent from $\mu$ is $\kappa$ and an offset voltage and its error is $\lambda$, the output of the scaling circuit is as in the formula (35).

$$V_o = \mu\kappa\theta\frac{1}{N}\delta\gamma\alpha V_i + \lambda \quad (35)$$

From the formula (35), the error of the inclination is $\kappa\theta\delta\alpha$ in one tap.

Therefore, the final output can be corrected in error by multiplying the multiplier $\gamma$ of the multiplication circuit 31*i* by $$\frac{1}{\kappa\theta\delta\alpha}.$$

As mentioned above, the tap coefficients are changed to be maximum one after another, a ramp wave is input and the inclination is measured from the output. The measured inclination is compared with the theoretical inclination $$\frac{\mu\gamma}{N}.$$

The error is the above $\kappa\theta\delta\alpha$.

Figure 7:
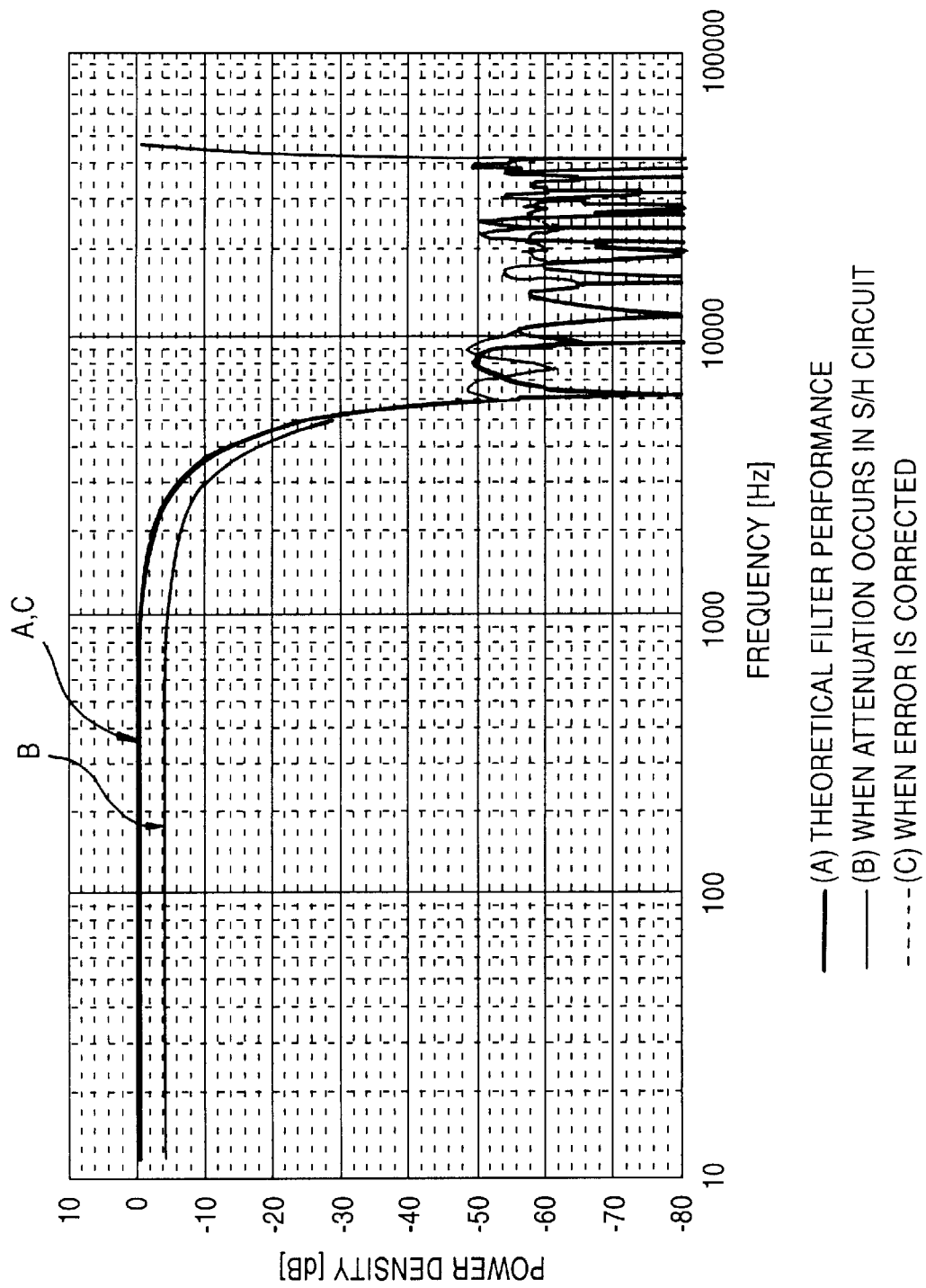
FIG. 7 is a diagram showing frequency response of the first embodiment.

FIG. 7 is a simulation result of frequency response showing the effect of the error correction. In the simulation, the number of taps is 32, coefficient accuracy is 8 bit, the sampling frequency is 48 kHz. The error of the sampling and holding circuit is assumed as an attenuation of $$\frac{31}{32}.$$

Therefore, the attenuation of the 32th tap is $$\frac{31^{32}}{32^{32}}.$$

The input signal is a M-system including a white noise. The curve B is the case including the attenuation. There occurs attenuation through the total frequencies. The curve C of the case of corrected coefficients is equivalent to the theoretical wave in the passband and has similar attenuation in the stopband.

As mentioned above, the error of the analog calculation circuit can be corrected by charging the multipliers according to the correction data without adding electrical elements such as resistance, capacitance etc. The calculation result is accurate.

The error correction can be applied to other circuits including analog-digital multiplication such as the filter circuit above.

Figure 8:
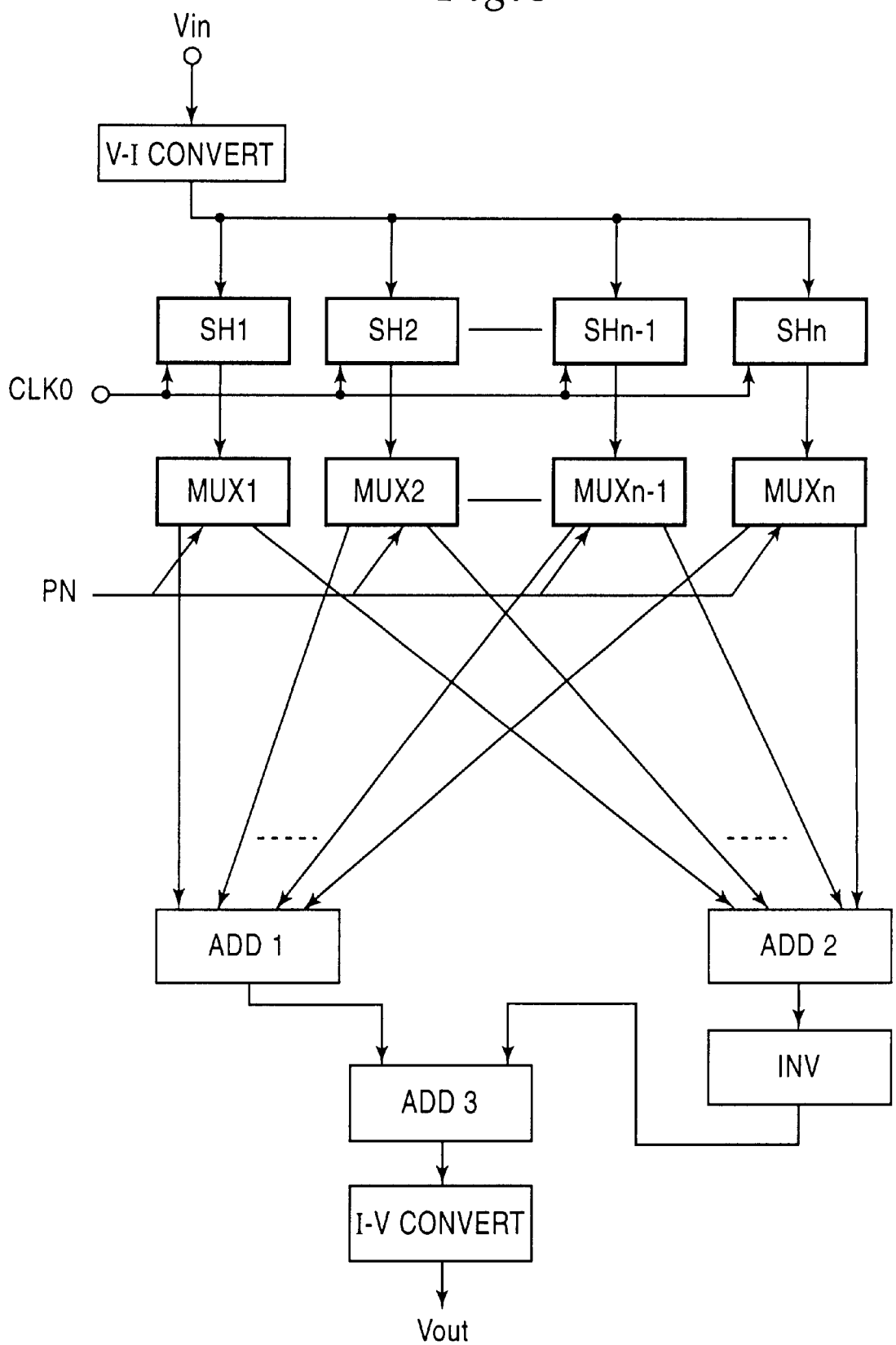
FIG. 8 is a block diagram of the second embodiment of the present invention.

FIG. 8 shows the second embodiment of a matched filter circuit for a code division multiple access communication system according to the present invention.

The filter circuit includes a voltage-current converter V-1 for converting a voltage signal into a current signal. The current signal is held by a plurality of sampling and holding circuits SH1 to SHn successively in response to a system clock CLK0. The data held by the sampling and holding circuits are not transferred through the sampling and holding circuits, so the transfer error is prevented. The outputs of the sampling and holding circuits are input to corresponding multi-plexers MUX1 to MUXn having two outputs. Each multi-plexer selectively outputs the input from the corresponding sampling and holding circuit from one of the two outputs in response to a control signal, that is, spreading code or PN code. The PN code is a 1 bit binary multiplier corresponding to two outputs. One of the outputs is introduced to the first adder ADD1 and the other is introduced to the second adder ADD2. An output of the second adder ADD2 is inverted by an inverter INV and is input to the third adder ADD3. An output of ADD1 is also input to ADD3 so as to be added to the inverted output of ADD2. An output of ADD3 is converted to a voltage signal by a current-voltage converter I-V.

Figure 9:
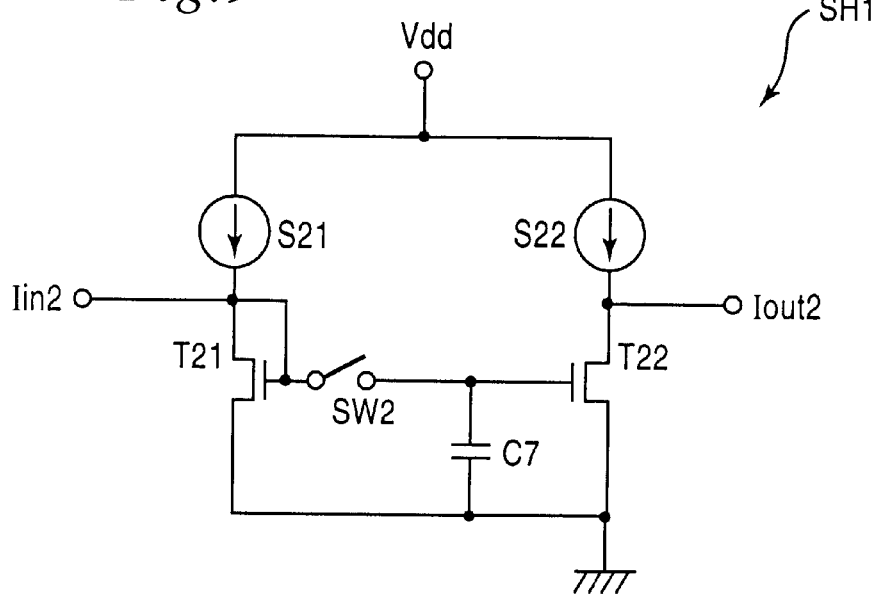
FIG. 9 is a circuit diagram of the sampling and holding circuit of the second embodiment.

FIG. 9 shows the sampling and holding circuit SH1 in FIG. 8. SH1 has a pair of MOS transistors T21 and T22 which are connected at their one terminal through constant current sources S21 and S22, respectively, to a high voltage Vdd. The other terminals are connected to a low (ground) voltage. Gates of the transistors T21 and T22 are connected through a control switch SW2 with each other. A grounded capacitance C7 is connected to a line between the switch SW2 and T22. An input current Iin2, an output of V-I, is input to a line between T21 and S21. An output current Iout2 is output from a line between S22 and T22. When T21 and T22 are substantially equivalent and SW2 is closed, SH1 becomes a current mirror circuit generating currents Iout2 equal to -Iin2. C7 is charged when SW2 is closed. A voltage caused by the electrical charge in C7 is put on the gate of T22, the output current Iout2 is kept even when SW2 is opened. Then, the analog current signal is held. A current between T21 and T22 is prevented by opening SW2. So, the electrical power consumption is low. The circuit size is much smaller than a circuit for holding a digital signal of a plurality of bits.

Description of SH2 to SH1 is neglected because these are similar to SH1.

Figure 10:
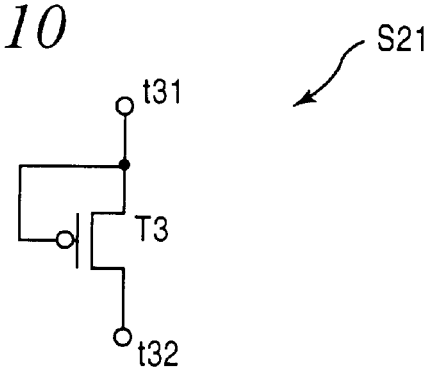
FIG. 10 is a circuit diagram of a constant current source in FIG. 9.

FIG. 10 shows the current source S21 in FIG. 9. S21 consists of a MOS transistor a gate of which is connected with a terminal t31 of higher voltage. A terminal t32 of lower voltage is connected with T21 in FIG. 9. The current source S22 is similar to S21, so the description therefor is omitted.

Figure 11:
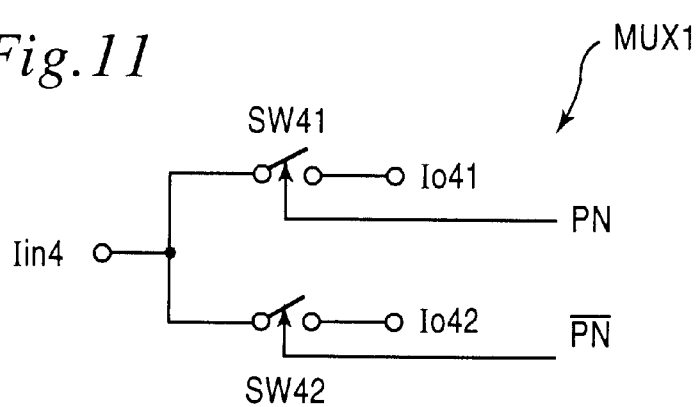
FIG. 11 is a circuit diagram of a multi-plexer in FIG. 8.

In FIG. 11, the multi-plexer MUX1 includes a pair of switches SW41 and SW42 which are connected to an input current Iin4. The switches are alternatively closed so that the input is introduced to one of outputs Io41 and Io42. The switches SW41 and SW42 are controlled by a PN code and its inversion, respectively. The multi-plexers MUX2 to MUXn are similar to MUX1, so descriptions are omitted.

Figure 12:
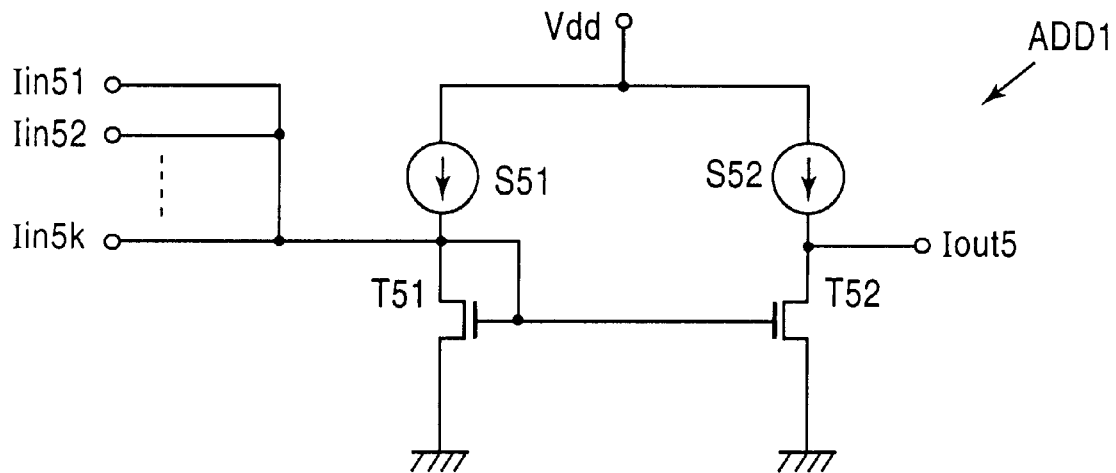
FIG. 12 is a circuit diagram of an adder in FIG. 8.

FIG. 12 shows the first adder ADD1. ADD1 is a current mirror circuit having a pair of MOS transistors T51 and T52, which are connected at their one terminals through constant current sources S51 and S52, respectively, to a high voltage Vdd. The other terminals are connected to a low (ground) voltage. A plurality of input currents Iin51 to Ii5k are connected to a line between T51 and S51 as well as to gates of T51 and T52. An output current Iout5 is output from a line between T52 and S52. When T51 and T52 have equivalent performance, Iout5 is an inversion of a summation of the input currents Iin51 to Iin5k as in the formula (36).

$$Iout5 = -\sum_{i=1}^{k} Iin5i \qquad (36)$$

The adders ADD2 and ADD3 are similar to ADD1, the description therefor is omitted.

Figure 13:
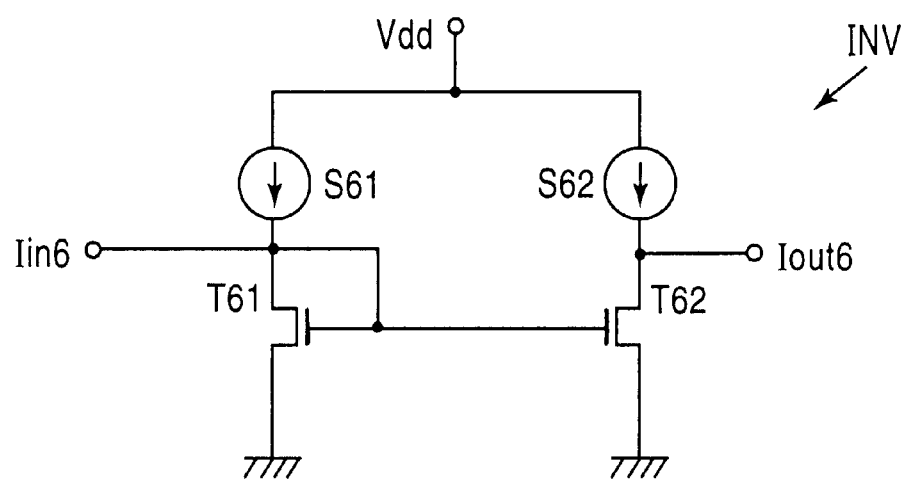
FIG. 13 is a circuit diagram of an inverter in FIG. 8.

As shown in FIG. 13, the inverter INV is a current mirror circuit having a pair of MOS transistors T61 and T62 which are connected at one terminal of T61 and one terminal of T62 through constant current sources S61 and S62, respectively, to a high voltage Vdd. The other terminals are connected to a low (ground) voltage. An input current Iin6 is connected to a line between T61 and S61 as well as to gates of T61 and T62. An output current Iout6 is output from a line between T62 and S62. When T61 and T62 have equivalent performance, Iout6 is an inversion of the input current Iin6.

Figure 14:
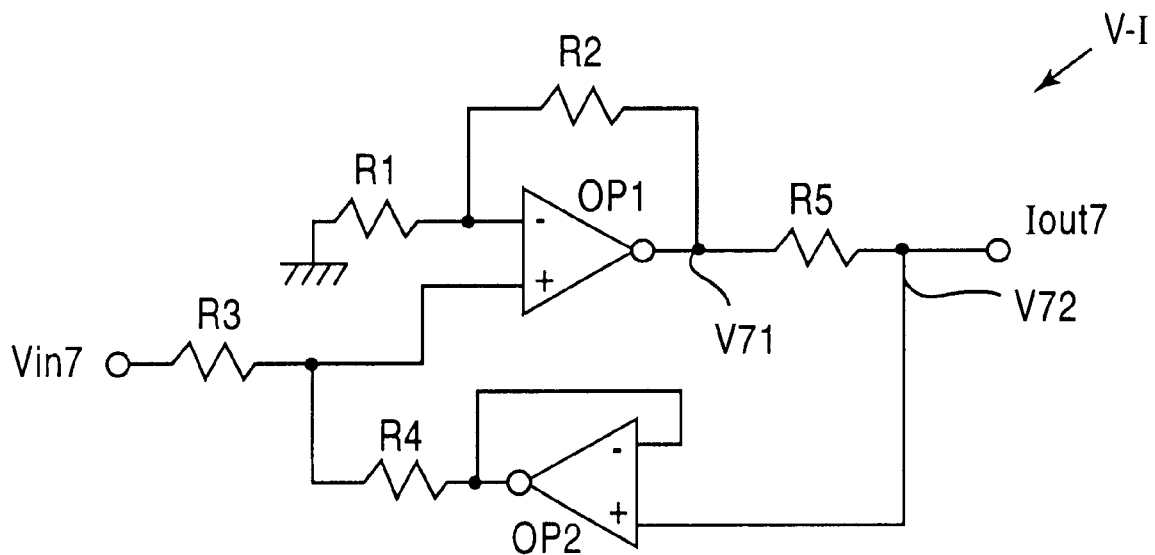
FIG. 14 is a circuit diagram of a voltage-current converter in FIG. 8.

In FIG. 14, the voltage current converter V-I has an operational amplifier OP1 receiving at its non-inverted input an input voltage Vin7 through a resistance R3. A reference voltage (ground voltage) is connected through a resistance R1 to the inverted input. An output of the operational amplifier OP1 is fed back to the inverted input through a resistance R2. OP1 outputs an output current Iout7 through a resistance R5. The output current is input to a non-inverted input of an operational amplifier OP2. An output of the operational amplifier OP2 is fed back to an inverted input of OP2 as well as input through a resistance R4 to the non-inverted input of OP1.

When output voltages of OP1 and R5 are V71 and V72, respectively, and R1=R2=R3=R4, the following formulae (37) and (38) are given.

$$V71 = V72 + Vin7 \qquad (37)$$

$$Iout7 = \frac{V71 - V72}{R5} = \frac{Vin7}{R5} \qquad (38)$$

Therefore, the voltage Vin7 is converted into the current Iout7

Figure 15:
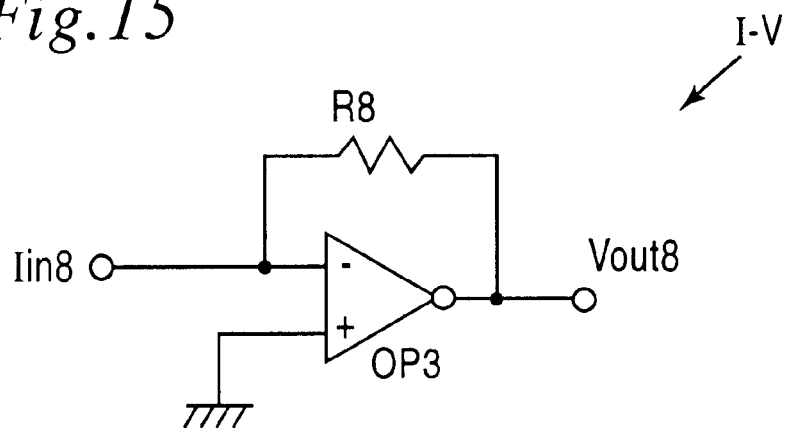
FIG. 15 is a circuit diagram of a current-voltage converter in FIG. 8.

FIG. 15 shows a current-voltage converter I-V having an operational amplifier OP3. An output current Iin8 is input at the inverted input of OP3 and an output of OP3 is fed through a resistance R8 back to the inverted input. The relationship between the input and output of I-V is as in the formula (39).

$$Vout8 = Iin8 \times R8 \qquad (39)$$

Figure 16:
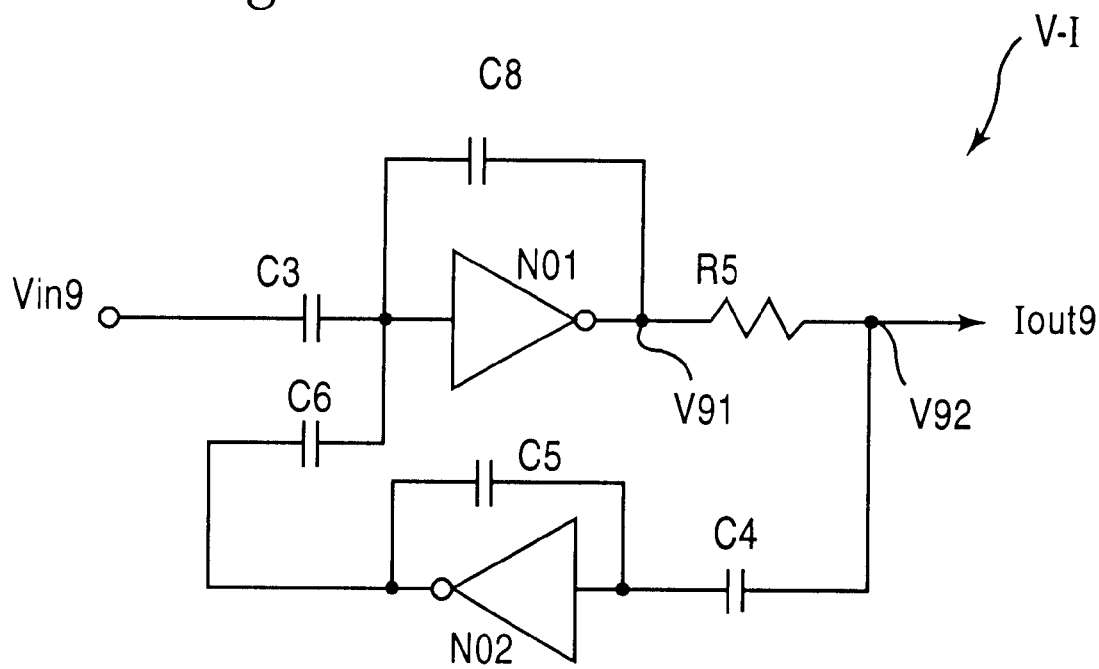
FIG. 16 is a circuit diagram of another voltage-current converter.

FIG. 16 is another voltage-current converter in which OP1 and OP2 in FIG. 14 are substituted by inverting amplifiers NO1 and NO2, respectively, each consisting of an odd number of serial CMOS inverters. An input voltage Vin9 is input through an input capacitance C3 to NO1, and an output of NO1 is connected through a feedback capacitance C8 to its input. A resistance R5 is connected to the output of NO1. The output of R5 is connected through a capacitance C4 to an input of NO2. An output of NO2 is connected through a capacitance C6 to the input of NO1 as well as through a capacitance C5 to its input.

When C8=C3=C4=C5=C6, the relationship between the input and output voltages are as in the formula (40).

$$Vin9 = V92 - V91 \qquad (40)$$

Then, the output current is as in the formula (41).

$$Iout9 = -\frac{V91 - V92}{R5} = \frac{Vin9}{R5} \qquad (41)$$

Figure 17:
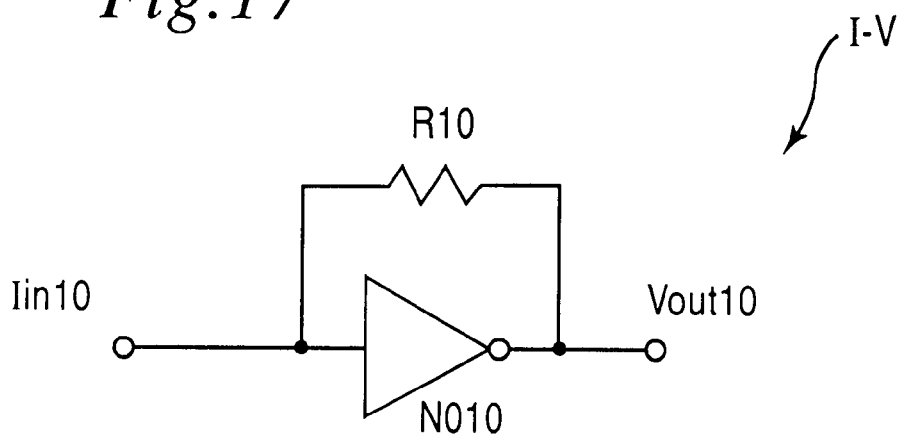
FIG. 17 is a circuit diagram of another current-voltage converter.
Figure 18:
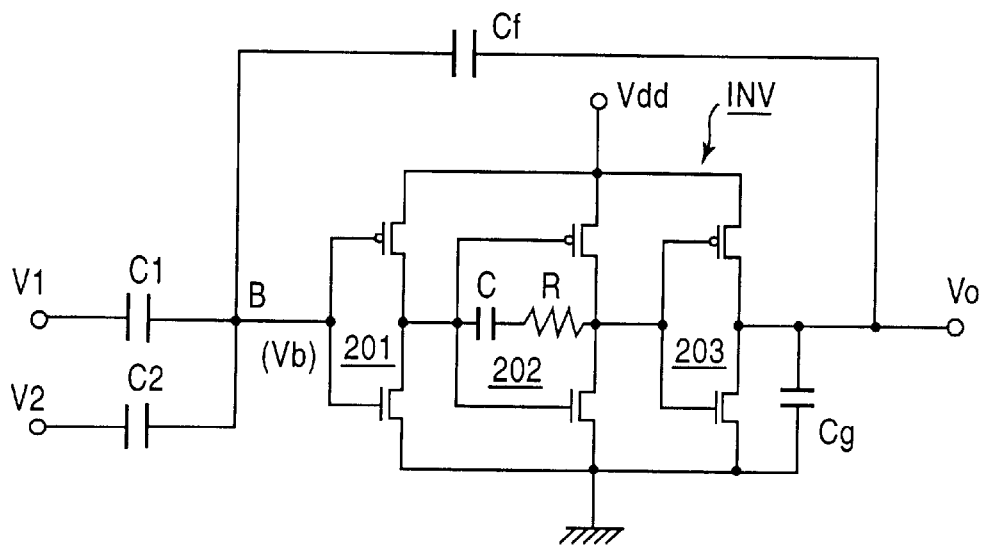
FIGS. 18(a) and (b) are circuit diagrams of a conventional adder.
Figure 18:
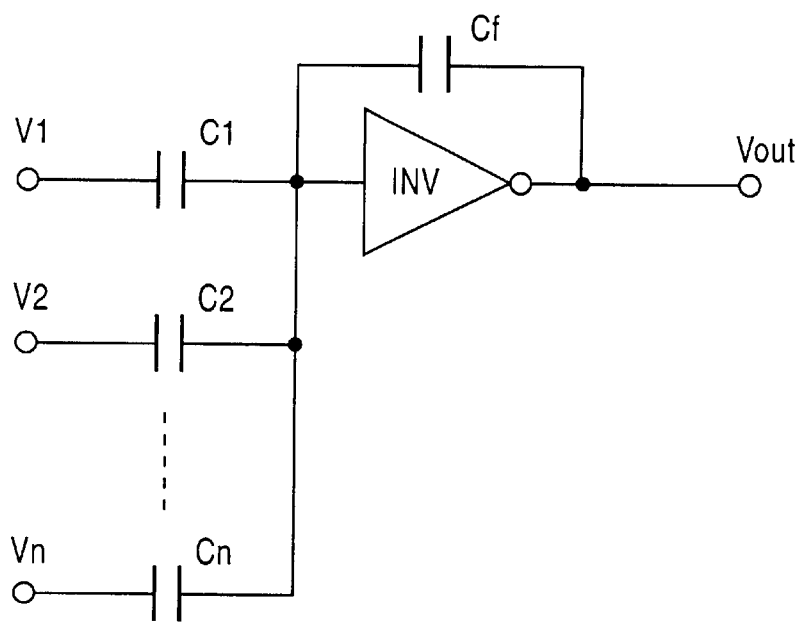
Figure 19:
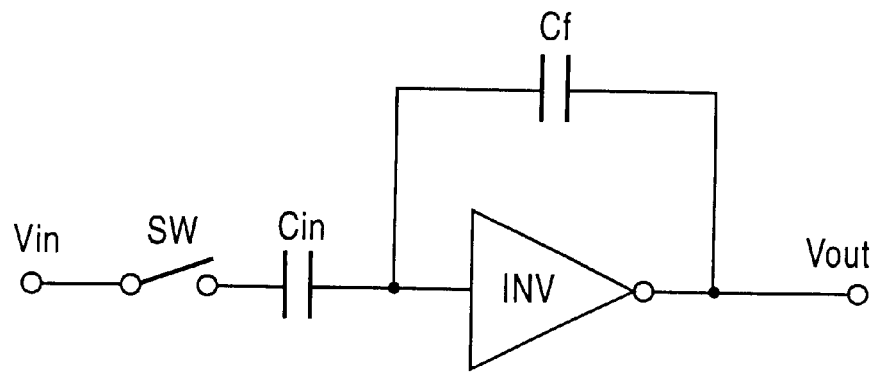
FIG. 19 is a circuit diagram of a conventional sampling and holding circuit.
Figure 20:
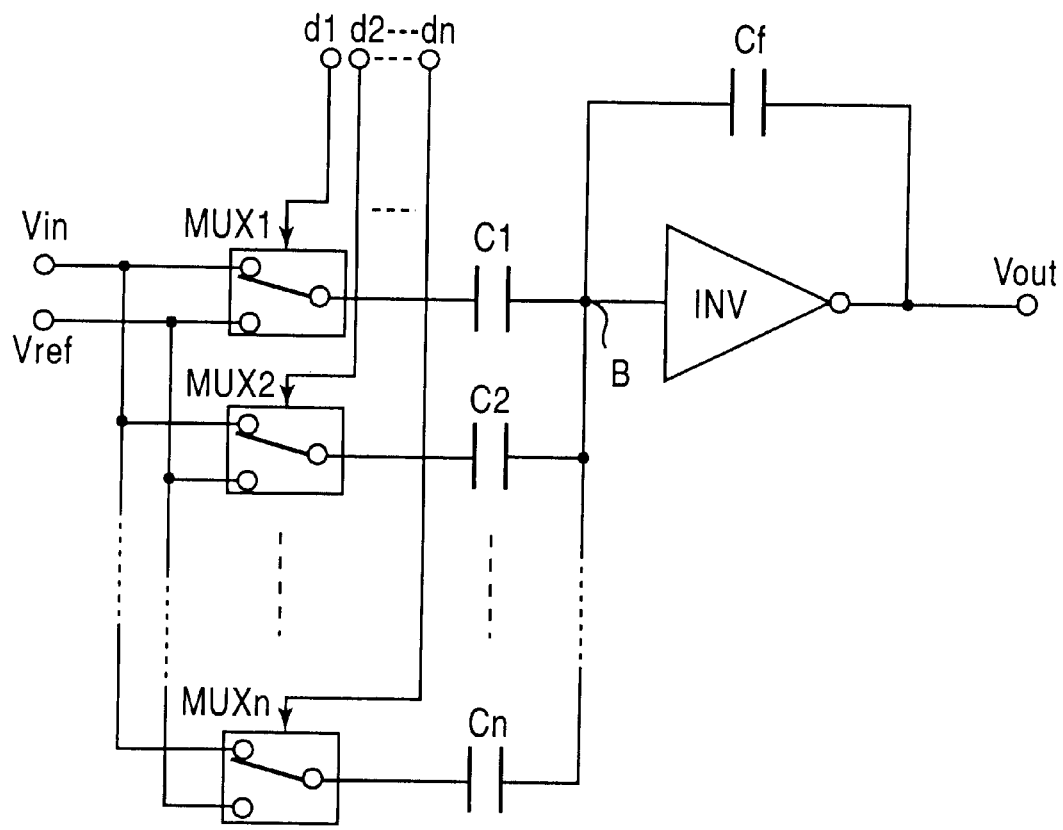
FIG. 20 is a circuit diagram of the conventional multiplication circuit.

FIG. 17 is another current-voltage converter. An input current Iin10 is input to an inverting amplifier NO10 and an output of NO10 is fed through a resistance R10 back to its input. The relationship between the input and output is as in the formula (42).

$$Vout10 = -Iin10 \times R10 \qquad (42)$$

What is claimed is:

1. A filter circuit comprising:
   a plurality of sampling and holding circuits for holding successive analog data, each of said plurality of sampling and holding circuits having an output for outputting one of said successive analog data;
   a plurality of multiplication circuits corresponding to said plurality of sampling and holding circuits, each of said plurality of multiplication circuits multiplying one of said successive analog data output from a corresponding sampling and holding circuit by a corresponding predetermined digital coefficient, each said multiplication circuit having an output for outputting a corresponding multiplied analog data; and
   an adder for summing said multiplied successive analog data output from said plurality of multiplication circuits and for outputting summed analog data,
   wherein said predetermined digital coefficient includes a factor for correcting errors caused by said plurality of multiplication circuits and said adder.

2. A filter circuit as claimed in claim 1, wherein each of said plurality of multiplication circuits multiplies said one of successive analog data output by said corresponding predetermined coefficient, said corresponding predetermined coefficient determined by circuitry including,
   a measuring unit measuring said summed analog data when predetermined analog data is input to said plurality of sampling and holding circuits,
   a comparing unit comparing output of said measuring unit with a theoretical output of said measuring unit, and
   a determining unit determning said corresponding predetermined coefficient of said plurality of multiplication circuits in response to said comparison.

3. A filter circuit as claimed in claim 1, wherein said plurality of sampling and holding circuits are connected in series to said analog data and said plurality of sampling and holding circuits successively sample said analog data.

4. A filter circuit as claimed in claim 1, wherein each of said plurality of sampling and holding circuits comprises:

a sampling circuit comprising a first input switch connected at its input terminal to said successive analog data, a first input capacitance connected at its input terminal to an output of said first input switch, a first inverting amplifier connected at its input terminal to an output of said first input capacitance and a first feedback capacitance connected between an output and said input of said first inverting amplifier; and a holding circuit comprising a second input switch connected at its input to said output of said first inverting amplifier of said sampling circuit, a second input capacitance connected at its input to an output of said second input switch, a second inverting amplifier connected at its input to an output of said second input capacitance and a second feedback capacitance connected between an output and said input of said second inverting amplifier.

5. A filter circuit as claimed in claim 1, wherein each of said plurality of multiplication circuits comprises:

a plurality of input capacitances having capacities corresponding to binary bits of said predetermined coefficient;

a plurality of input switches corresponding to said input capacitances, each of said plurality of input switches alternatively connects one of an input voltage and a reference voltage to said corresponding input capacitance;

an inverting amplifier connected at its input to outputs of each of said input capacitances; and a feedback capacitance connected between an output and said input of said inverting amplifier.

6. A filter circuit as claimed in claim 1, said adder comprising:

a plurality of input capacitances corresponding to said plurality of multiplication circuits;

an inverting amplifier connected at its input to outputs of each of said input capacitances; and a feedback capacitance connected between an output and said input of said inverting amplifier.

7. A filter circuit as claimed in claim 1, further comprising a scaling circuit comprising:

a plurality of input capacitances;

a plurality of input switches corresponding to said plurality of input capacitances, each of said input switches alternatively connecting one of the summed analog data and a first reference voltage to said corresponding input capacitance;

an inverting amplifier connected at its input to outputs of each of said input capacitances;

a plurality of feedback capacitances commonly connected at their inputs to said input of said inverting amplifier; and a plurality of feedback switches, each corresponding to one of said feedback capacitances, each said feedback switch alternatively connecting an output of said inverting amplifier to an output of said corresponding feedback capacitance or a second refernce voltage.

8. A method for correcting calculation for an analog-digital multiplication circuit comprising:

measuring output from said analog-digital multiplication circuit when a predetermined analog data is input to the analog-digital multiplication circuit;

comparing a measured output of said analog-digital multiplication circuit with a theoretical output value derived from a formula $\mu\gamma/N$, where $\mu$ is a scaling factor, $\gamma$ is a multiplier and $N$ is a number of inputs to an adder; and changing a digital multiplier of the analog-digital multiplication circuit in response to said compared output.

* * * * *